(12) United States Patent
Subramanian et al.

(10) Patent No.: US 6,773,954 B1
(45) Date of Patent: *Aug. 10, 2004

(54) METHODS OF FORMING PASSIVE LAYERS IN ORGANIC MEMORY CELLS

(75) Inventors: Ramkumar Subramanian, Sunnyvale, CA (US); Jane V. Oglesby, Mountain View, CA (US); Sergey D. Lopatin, Santa Clara, CA (US); Mark S. Chang, Los Altos, CA (US); Christopher F. Lyons, Fremont, CA (US); James J. Xie, San Jose, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/313,494

(22) Filed: Dec. 5, 2002

(51) Int. Cl.⁷ .............................................. H01L 51/40
(52) U.S. Cl. .......................................... 438/99; 257/40
(58) Field of Search ..................... 438/82, 99; 257/40, 257/E39.007, E51.001, E51.013, E21.007, E21.024, E21.254, E21.299; 29/25.03; 252/62.3

(56) References Cited

U.S. PATENT DOCUMENTS

| | | | | |
|---|---|---|---|---|
| 4,127,412 A | * | 11/1978 | Rule et al. | 430/73 |
| 4,663,270 A | | 5/1987 | Potember et al. | 430/495 |
| 5,589,692 A | | 12/1996 | Reed | 257/23 |
| 6,055,180 A | | 4/2000 | Gudesen et al. | 365/175 |
| 6,208,553 B1 | | 3/2001 | Gryko et al. | 365/151 |
| 6,212,093 B1 | | 4/2001 | Lindsey | 365/151 |
| 6,272,038 B1 | | 8/2001 | Clausen et al. | 365/181 |
| 6,314,019 B1 | | 11/2001 | Kuekes et al. | 365/151 |
| 6,320,200 B1 | | 11/2001 | Reed et al. | 257/40 |
| 6,324,091 B1 | | 11/2001 | Gryko et al. | 365/151 |
| 6,348,700 B1 | | 2/2002 | Ellenbogen et al. | 357/40 |
| 6,614,048 B2 | * | 9/2003 | Leuschner | 257/40 |
| 2003/0085398 A1 | * | 5/2003 | Koyama et al. | 257/40 |
| 2003/0168675 A1 | * | 9/2003 | Hofmann et al. | 257/200 |

* cited by examiner

*Primary Examiner*—W. David Coleman
(74) *Attorney, Agent, or Firm*—Amin & Turocy, LLP (57) ABSTRACT

Methods of making an organic memory cell made of two electrodes with a controllably conductive media between the two electrodes are disclosed. The controllably conductive Media contains an organic semiconductor layer and passive layer. In particular, novel methods of forming a electrode and adjacent passive layer are described.

23 Claims, 7 Drawing Sheets

METHODS OF FORMING PASSIVE LAYERS IN ORGANIC MEMORY CELLS

TECHNICAL FIELD

The present invention generally relates to forming passive layers in organic memory cells. In particular, the present invention relates to efficient methods of forming passive layers thereby facilitating the function of an organic semiconductor memory cells.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed.

Electronic addressing or logic devices, for instance for storage or processing of data, are made with inorganic solid state technology, and particularly crystalline silicon devices. The metal oxide semiconductor field effect transistor (MOSFET) is one the main workhorses.

Much of the progress in making computers and memory devices faster, smaller and cheaper involves integration, squeezing ever more transistors and other electronic structures onto a postage-stamp-sized piece of silicon. A postage-stamp-sized piece of silicon may contain tens of millions of transistors, each transistor as small as a few hundred nanometers. However, silicon-based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid stale devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides organic memory devices that possess one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

One aspect of the present invention relates to a method of making an organic memory cell by providing a first electrode material in memory cell wells; removing a portion of the first electrode material to form first electrodes in the wells; depositing a passive layer material over the substrate; chemical mechanical polishing the passive layer material to form a passive layer in the well; forming an organic semiconductor layer over the passive layer; and providing a second electrode over the organic semiconductor layer.

Another aspect of the present invention relates to a method of making an organic memory cell by providing a first electrode material in memory cell wells; removing a portion of the first electrode material to form first electrodes in the wells; forming a passive layer over(the first electrodes in the wells; forming an organic semiconductor layer over the passive layer; and providing a second electrode over the organic semiconductor layer.

Yet another aspect of the present invention relates to a method of making an organic memory cell by forming a passive layer comprising a conductivity facilitating compound over a first electrode in a substrate; patterning a mask over the substrate, so that the mask is positioned over the first electrode thereby leaving exposed portions of the passive layer; removing the exposed portions of the passive layer; removing the mask; forming an organic semiconductor layer over the passive layer; and providing a second electrode over the organic semiconductor layer.

Still yet another aspect of the present invention relates to a method of making an organic memory cell by providing a first electrode material in substrate wells and over the substrate; simultaneously removing a first portion of the first electrode material and converting a second portion of the first electrode material to a passive material to form first electrodes and passive layers in the wells; forming an organic semiconductor layer over the passive layer; and providing a second electrode over the organic semiconductor layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The present invention involves organic memory cells made of two electrodes with a controllably conductive media between the two electrodes. The controllably conductive media contains an organic semiconductor layer and passive layer. The present invention more specifically involves efficient methods of forming electrodes and the passive layers in organic memory cells.

The organic memory cells may optionally contain additional layers, such as additional electrodes, charge retention layers, and/or chemically active layers. The impedance of the controllably conductive media changes when an external stimuli such as an applied electric field is imposed. A plurality of organic memory cells, which may be referred to as an array, form an organic memory device. In this connection, organic memory cells may form an organic memory devices and function in a manner analogous to metal oxide semiconductor field effect transistors (MOSFETs) in conventional semiconductor memory devices. However, there are advantages to using the organic memory cells instead of conventional MOSFETs in memory devices.

Figure 1:
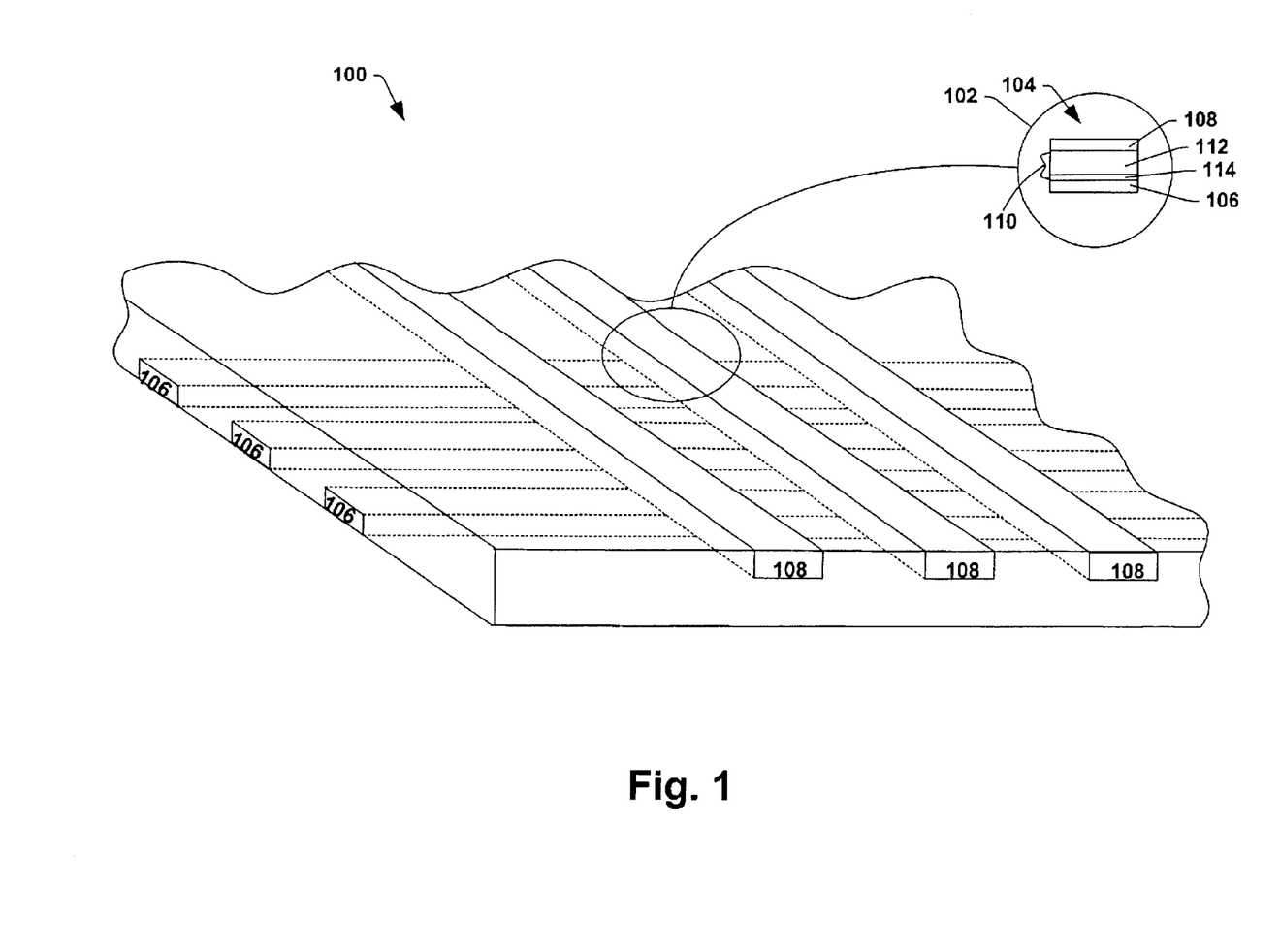
FIG. 1 illustrates a perspective view of a two dimensional microelectronic device containing a plurality of organic memory cells in accordance with one aspect of the invention.
Figure 2:
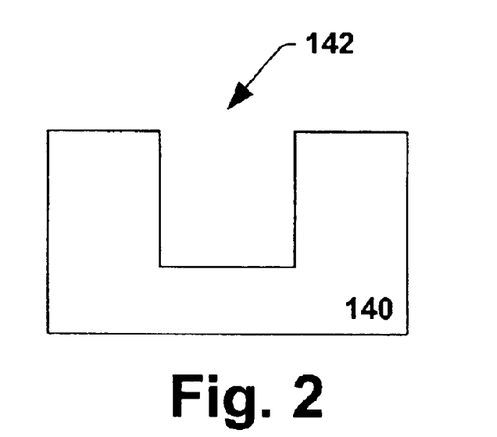
FIGS. 2 to 5 illustrate a cross-sectional view of forming an electrode and a passive layer in an organic memory cell in accordance with one aspect of the present invention.

Referring to FIG. 1, a brief description of a microelectronic organic memory device 100 containing a plurality of organic memory cells in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 10 therebetween. The controllably conductive media 110 contains an organic semiconductor layer 112 and passive layer 114. Peripheral and connective circuitry and devices are not shown for brevity.

Each of the organic memory cells 110 is formed within a memory cell well (not explicitly shown), which surrounded by dielectric material (and peripheral and connective circuitry). In other words, the microelectronic organic memory device 100 contains a plurality of organic memory cells 110 disposed within memory cell wells that are surrounded by dielectric material. Dielectric materials include monocrystalline silicon, silicon dioxide, silicon nitride, silicon oxynitride, low k materials, silicate glasses, and the like. In FIG. 1, portions of the microelectronic organic memory device 100 that are not the plurality of organic memory cells 110 are dielectric materials (again, except for the presence of peripheral and connective circuitry).

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Examples of electrodes include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon: metal suicides; and the like. Alloy electrodes specifically include Hastelloy®, Kovar®, Invar, Monel®, Inconel®, brass, stainless steel, magnesium-silver alloy, and various other alloys.

In one embodiment, the thickness of each electrode is independently about 0.01 $\mu$m or more and about 10 m or less. In another embodiment, the thickness of each electrode is independently about 0.05 $\mu$m or more and about 5 $\mu$m or less. In yet another embodiment, the thickness of each electrode is independently about 0.1 $\mu$m or more and about 1 $\mu$m or less.

The controllably conductive media, disposed between the two electrodes, can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, and a semiconductive state.

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more passive layers. In one embodiment, the controllably conductive media contains at least one organic semiconductor layer that is adjacent a passive layer (without any intermediary layers between the organic semiconductor layer and passive layer).

The organic semiconductor layer contains at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6–C60 carbon nanotubes), and the like. Organic semiconductors thus have a carbon based structure, often a carbon-hydrogen based structure, which is different from conventional MOSFETs. The organic semiconductor materials are typically characterized in that they have overlapping π orbitals, and/or in that they have at least two stable oxidation states. The organic semiconductor materials are also characterized in that they may assume two or more resonant structures. The overlapping π orbitals contribute to the controllably conductive properties of the controllably conductive media. The amount of charge injected into the organic semiconductor layer also influences the degree of conductivity of the organic semiconductor layer.

A carbon nanotube is typically a hexagonal network of carbon atoms (from about 6 to about 60 carbon atoms, typically) that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminster-fullerene, a soccerball-shaped 60-atom cluster of pure carbon.

The organic polymer typically contains a conjugated organic polymer. The polymer backbone of the conjugated organic polymer extends lengthwise between the electrodes (generally substantially perpendicular to the inner, facing surfaces of the electrodes). The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the organic semiconductor layer, such as the conjugated organic polymer, has the ability to donate and accept charges (holes and/or electrons). Generally, the organic semiconductor or an atom/moiety in the polymer has at least two relatively stable oxidation states. The two relatively stable oxidation states permit the organic semiconductor to donate and accept charges and electrically interact with the conductivity facilitating compound. The ability of the organic semiconductor layer to donate and accept charges and electrically interact with the passive layer also depends on the identity of the conductivity facilitating compound.

The organic polymers (or the organic monomers constituting the organic polymers) may be cyclic or acyclic. During formation or deposition, the organic polymer self assembles between the electrodes. Examples of conjugated organic polymers include one or more of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like.

Chemical structures of examples of repeating units/moieties that make up the conjugated organic polymers and conjugated organometallic polymers include one or more of Formulae (I) to (XIII):

wherein each R is independently hydrogen or hydrocarbyl; each M is independently a metal; each E is independently O, N, S, Se, Te, or CH; each L is independently a group containing or continuing conjugation (unsaturation); and each n is independently about 1 or more and about 25,000 or less. In another embodiment, each n is independently about 2 or more and about 10,000 or less. In yet another embodiment, each n is independently about 20 or more and about 5,000 or less. Examples of metals include Ag, Al, Au, B, Cd, Co, Cu, Fe, Ga, Hg, Ir, Mg, Mn, Ni, Pb, Pd, Pt, Rh, Sn, and Zn. Examples of L groups include hydrocarbyl groups possessing conjugation or the ability to form resonance structures, such as phenyl groups, substituted phenyl groups, acetylene groups, and the like.

Any of the formulae may have one or more pendent substituent groups, not shown in the formulae. For example, a phenyl group may appear on the polythiophene structure, such as on the 3 position of each thiophene moiety. As another example, alkyl, alkoxy, cyano, amino, and/or hydroxy substituent groups may be present on the phenyl rings in any of the polyphenylacetylene, polydiphenylacetylene, and poly(p-phenylene vinylene) conjugated polymers.

The term "hydrocarbyl" includes hydrocarbon as well as substantially hydrocarbon groups. Hydrocarbyl groups contain 1 or more carbon atom and typically about 60 or less carbon atoms. In another embodiment, hydrocarbyl groups contain 2 or more carbon atoms and about 30 or less carbon atoms. Substantially hydrocarbon describes groups which contain heteroatom substituents or heteroatoms which do not alter the predominantly organic character of the polymer, and do not impede the ability of the organic polymer to form a conjugated structure. Examples of hydrocarbyl groups include the following:

(1) hydrocarbon substituents i.e., aliphatic (e.g., alkyl or alkenyl), alicyclic (e.g., cycloalkyl, cycloalkenyl) substituents, acyl, phenyl, aromatic-, aliphatic- and alicyclic-substituted aromatic substituents and the like as well as cyclic substituents wherein the ring is completed through another portion of the molecule (that is, for example, any two indicated substituents may together form an alicyclic radical);

(2) substituted hydrocarbon substituents, i.e., those substituents containing non-hydrocarbon groups which, in the context of this invention, do not alter the predominantly organic nature of the subsistent; those skilled in the art will be aware of such groups (e.g., halo (especially chloro and fluoro, such as perfluoroalkyl, perfluoroaryl), cyano, thiocyanato, amino, alkylamino, sulfonyl, hydroxy, mercapto, nitro, nitroso, sulfoxy, etc.);

(3) heteroatom substituents, i.e., substituents which, while having a predominantly organic character within the context of this invention, contain an atom other than carbon present in a ring or chain otherwise composed of carbon atoms (e.g., alkoxy, alkylthio). Suitable heteroatoms will be apparent to those of ordinary skill in the art and include, for example, sulfur, oxygen, nitrogen, fluorine, chlorine, and such substituents as, e.g., pyridyl, furyl, thienyl, imidazolyl, imido, amido, carbamoyl, etc.

In one embodiment, the organic semiconductor layer contains a thin layer designed to improve or lengthen charge retention time. The thin layer may be disposed anywhere within the organic semiconductor layer, but typically near the middle of the layer. The thin layer contains any of the electrode materials or the compounds of the below-described heterocyclic/aromatic compound layer. In one embodiment, the thin layer has a thickness of about 50 Å or more and about 0.1 $\mu$m or less. In another embodiment, the thin layer has a thickness of about 100 Å or more and about 0.05 $\mu$m or less. For example, an organic memory cell may contain a first electrode of copper, a passive layer of copper sulfide, an organic semiconductor layer of poly(phenylene vinylene), and a second electrode of aluminum, wherein the poly(phenylene vinylene) organic semiconductor layer contains a 250 Å thick layer of copper therein.

In one embodiment, the organic semiconductor material does not contain an organometallic compound. In another embodiment, the organic semiconductor material contains an organic polymer doped with an organometallic compound. In yet another embodiment, the organic memory cells optionally contain an organometallic compound layer. In still yet another embodiment, the organic semiconductor material contains an organometallic compound. Examples of the chemical structures of various organometallic compounds include Formulae (XIV) to (XVII):

wherein M and E are as defined above.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the organic semiconductor layer has a thickness of about 0.001 μm or more and about 5 μm or less. In another embodiment, the organic semiconductor layer has a thickness of about 0.01 μm or more and about 2.5 μm or less. In yet another embodiment, the organic semiconductor layer has a thickness of about 0.05 μm or more and about 1 μm or less.

The organic semiconductor layer may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the organic semiconductor material self assembles between the electrodes. It is not typically necessary to functionalize one or more ends of the organic polymer in order to attach it to an electrode/passive layer.

A covalent bond may be formed between the organic semiconductor material and the passive layer. Alternatively, close contact is required to provide good charge carrier/electron exchange between the organic semiconductor layer and the passive layer. The organic semiconductor layer and the passive layer are electrically coupled in that charge carrier/electron exchange occurs between the two layers.

A passive layer contains at least one conductivity facilitating compound that contributes to the controllably conductive properties of the controllably conductive media. The conductivity facilitating compound has the ability to donate and accept charges (holes and/or electrons). The passive layer thus may transport between an electrode and the organic polymer layer/passive layer interface, facilitate charge/carrier injection into the organic polymer layer, and/or increase the concentration of a charge carrier in the organic polymer layer. In some instances, the passive layer may store opposite charges thereby providing a balance of charges in the organic memory device as a whole. Storing charges/charge carriers is facilitated by the existence of two relatively stable oxidation states for the conductivity facilitating compound.

Generally, the conductivity facilitating compound or an atom in the conductivity facilitating compound has at least two relatively stable oxidation states. The two relatively stable oxidation states permit the conductivity facilitating compound to donate and accept charges and electrically interact with the organic semiconductor layer. The particular conductivity facilitating compound employed in a given organic memory cell is selected so that the two relatively stable oxidation states match with the two relatively stable oxidation stales of the organic semiconductor material. Matching the energy bands of two relatively stable oxidation states of the organic semiconductor material and the conductivity facilitating compound facilitate charge carrier retention in the organic semiconductor layer.

Matching energy bands means that the fermi level of the passive layer is close to the valence band of the organic semiconductor layer. Consequently, the injected charge carrier (into the organic semiconductor layer) may recombine with the charge at the passive layer if the energy band of the charged organic semiconductor layer does not substantially change. Matching energy bands involves compromising between ease of charge injection and length of charge (data) retention time.

In one embodiment, when matching energy bands, the fermi level of the passive layer is within about 0.3 eV of the valence band of the organic semiconductor layer. In another embodiment, the ferni level of the passive layer is within about 0.25 eV of the valence band of the organic semiconductor layer. In yet another embodiment, the fermi level of the passive layer is within about 0.2 eV of the valence band of the organic semiconductor layer. In still yet another embodiment, the fermi level of the passive layer is within about 0.15 eV of the valence band of the organic semiconductor layer.

The applied external field can reduce the energy barrier between passive layer and organic layer depending on the field direction. Therefore, enhanced charge injection in the forward direction field in programming operation and also enhanced charge recombination in reversed field in erase operation can be obtained.

The passive layer may in some instances act as a catalyst when forming the organic semiconductor layer, particularly when the organic semiconductor layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the conjugated organic polymers are self aligned in a direction that traverses the two electrodes.

Examples of conductivity facilitating compounds that may make up the passive layer include one or more of copper sulfide ($Cu_2S$, $CuS$), copper rich copper sulfide ($Cu_3S/Cu_2S$, $Cu_3S/CuS$), copper oxide ($CuO$, $Cu_2O$), manganese oxide ($MnO_2$), titanium dioxide ($TiO_2$), indium oxide ($I_3O_4$), silver sulfide ($Ag_2S$, $AgS$), gold sulfide ($Au_2S$, $AuS$), iron oxide ($Fe_3O_4$), nickel arsenide ($NiAs$), cobalt arsenide ($CoAs_2$), and the like. The conductivity facilitating compounds do not dissociate into ions under the strength of the electric field. The passive layer may contain two or more sub-passive layers, each sub-layer containing the same, different, or multiple conductivity facilitating compounds.

In one embodiment, the passive layer containing the conductivity facilitating compound has a thickness of about 2 Å or more and about 0.1 $\mu$m or less. In another embodiment, the passive layer has a thickness of about 10 Å or more and about 0.01 m or less. In yet another embodiment, the passive layer has a thickness of about 50 Å or more and about 0.005 $\mu$m or less.

In order to facilitate operation of the organic memory cells, the organic semiconductor layer is thicker than the passive layer. In one embodiment, the thickness of the organic semiconductor layer is from about 10 to about 500 times greater than the thickness of the passive layer. In another embodiment, the thickness of the organic semiconductor layer is from about 25 to about 250 times greater than the thickness of the passive layer.

The passive layer and adjacent electrode may be formed in a number of different manners in accordance with the present invention. Generally speaking, an electrode material is deposited into an organic memory cell well, optionally a portion of the electrode material is removed, and then the passive layer is formed over the electrode material.

For example, FIGS. 2 to 5 show an exemplary aspect of forming a passive layer and a first electrode for an organic memory cell in accordance with the present invention. Specifically referring to FIG. 2, a memory substrate or wafer is provided containing a dielectric material 140. Within the wafer or dielectric material 140 are a plurality of organic memory cell wells 142. Although only one well 142 is shown, the entire wafer may have hundreds, thousands, or millions of wells, depending upon the size of the wells 142 and the size of the wafer. As shown, the organic memory cell well 142 is partially formed, as it will subsequently contain the first electrode and passive layer. Additional dielectric material will be formed to surround the organic semiconductor material and second electrode.

Figure 3:
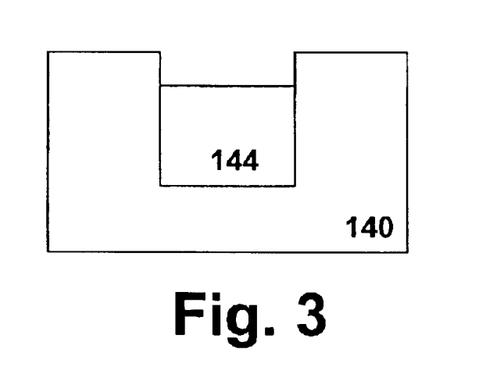

Referring to FIG. 3, the first electrode 144 is formed within the well 142. In this respect, the electrode is preferably a conductive metal, and it is formed by electroplating. Numerous electrode materials are described above. Electroplating techniques are known, and thus are not discussed here for brevity sake. Specifically, for example, copper may be electroplated within well 142 to form first electrode 144. If the conductive metal electroplated within the well 142 reaches the top of well, the polarity is momentarily reversed, causing reverse plating and resulting in a removal of a small portion of the metal. Consequently, as shown in FIG. 3, first electrode 144 does not reach the top of the well 142. If the conductive metal electroplated within the well 142 reaches the top of well, the amount of electrode material removed is approximately equal to the resultant thickness of the subsequently formed passive layer.

Figure 4:
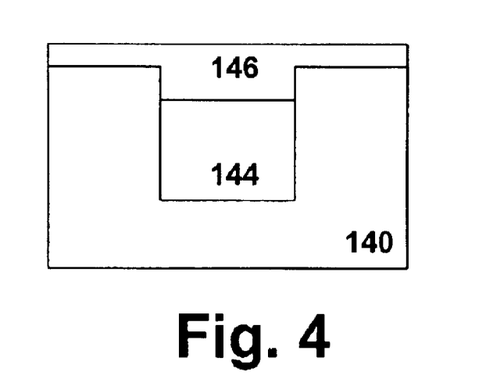

Referring to FIG. 4, a passive layer material 146 is deposited on the substrate (over the dielectric material 140 and the first electrode 144). For example, using gas phase reactions or CVD techniques, copper sulfide or copper oxide may be deposited over the substrate including over the copper electrode. Silver sulfide may be deposited over the substrate when a silver electrode is employed. Any material described to make the passive layer above may be employed.

Figure 5:
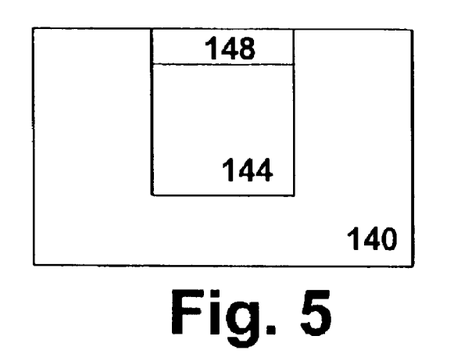
Figure 6:
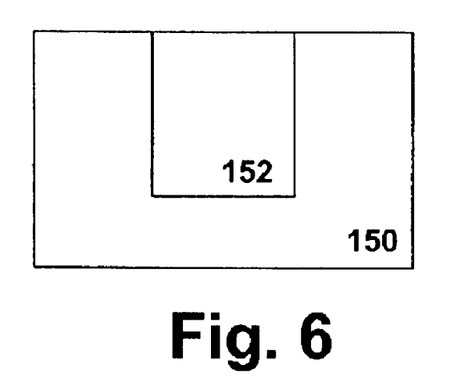
FIGS. 6 to 9 illustrate a cross-sectional view of forming an electrode and a passive layer in an organic memory cell in accordance with another aspect of the present invention.

Referring to FIG. 5, chemical mechanical polishing (CMP) techniques are employed to planarize the substrate and confine the passive material to the well 142 thereby forming a passive layer 148 of a subsequently formed organic memory cell. CMP techniques are known, and thus are not discussed here for brevity sake.

FIGS. 6 to 9 show another exemplary aspect of forming a passive layer and first electrode for an organic memory cell in accordance with the present invention. Specifically referring to FIG. 6, a memory substrate or wafer is provided containing a dielectric material 150 within which are a plurality of organic memory cell wells. A first electrode 152 is formed within the wells. In this respect, the electrode is preferably a conductive metal, and it is formed by any suitable means including electroplating or sputtering (PVD) followed by CMP. Numerous electrode materials are described above. Electroplating and sputtering techniques are known, and thus are not discussed here for brevity sake.

Figure 7:
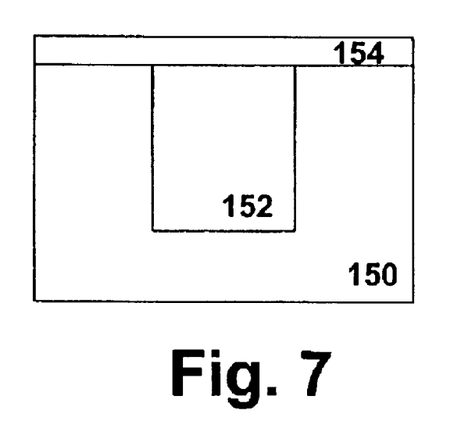

Referring to FIG. 7, a passive layer material 154 is deposited on the substrate (over the dielectric material 150 and the first electrode 152). For example, using gas phase reactions or CVD techniques, copper sulfide or copper oxide may be deposited over the substrate including over the first electrode containing copper. Or silver sulfide may be deposited over the substrate when a first electrode containing silver is employed. Any material described to make the passive layer above may be employed.

Figure 8:
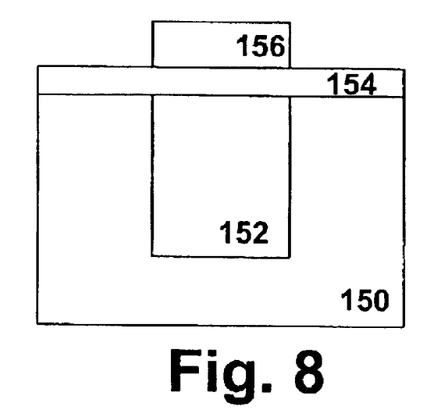

Referring to FIG. 8, a mask 156, such as a phiotoresist or a hardmask, is patterned using photolithography techniques over the substrate so that openings in the mask 158 are positioned over the dielectric material 150 leaving portions of the passive layer material 154 exposed while the mask material is positioned over the First electrodes 152 cover the other portions of the passive layer material 154.

Figure 9:
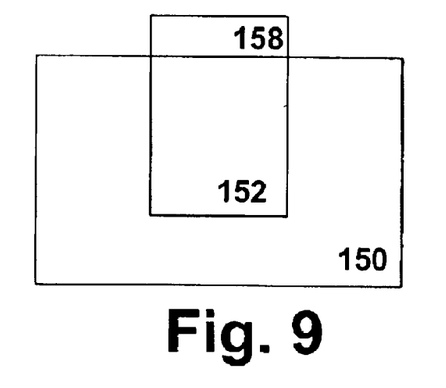
Figure 10:
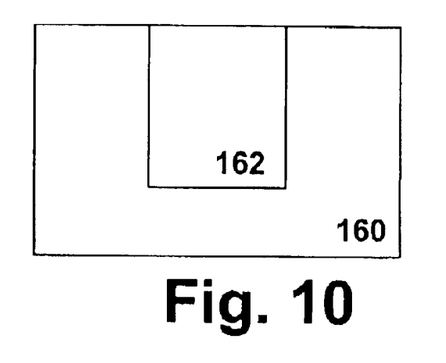
FIGS. 10 to 13 illustrate a cross-sectional view of forming an electrode and a passive layer in an organic memory cell in accordance with vet another aspect of the present invention.

Referring to FIG. 9, the exposed portions of the passive layer material 154 (the portions not positioned above the first electrodes 152) are removed by wet or dry etching techniques. The patterned mask 156 is then stripped from the substrate. A passive layer 158 is thereby formed over the first electrode 152 of a subsequently formed organic memory cell.

FIGS. 10 to 13 show still another exemplary aspect of forming a passive layer and first electrode for an organic memory cell in accordance with the present invention. Specifically referring to FIG. 10, a memory substrate or wafer is provided containing a dielectric material 160 within which are a plurality of organic memory cell wells. A conductive metal 162 is formed within the wells. In this respect, the conductive metal is formed by any suitable means including electroplating or sputtering (PVD) followed by CMP. Any of the numerous electrode materials may be employed and these materials are described above.

Figure 11:
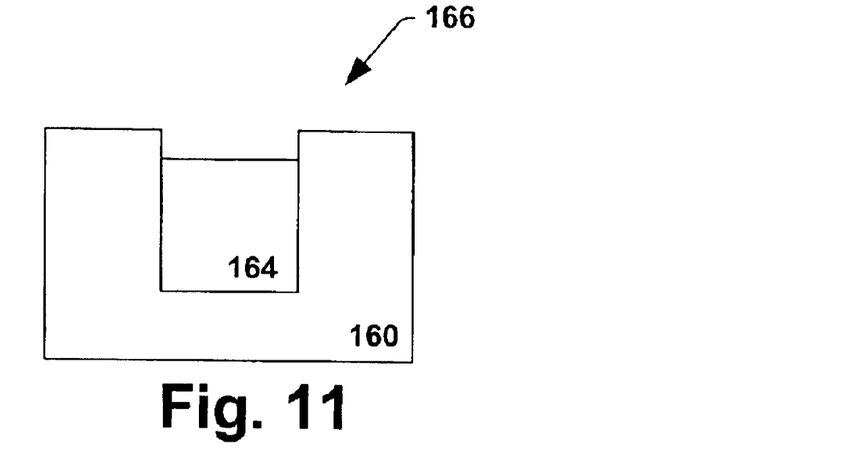

Referring to FIG. 11, the first electrode 164 is formed within the well 166 after removal of a small portion of the metal. The first electrode 164 does not reach the top of the well. If the conductive metal formed within the well reaches the top of well, the amount of electrode material removed is approximately equal to the resultant thickness of the subsequently formed passive layer. If the conductive metal is electroplated within the well, the polarity is momentarily reversed, causing reverse plating and resulting in a removal of a small portion of the metal. If the conductive metal is sputtered into the well, selective etching results in removal of a small portion of the metal.

Figure 12:
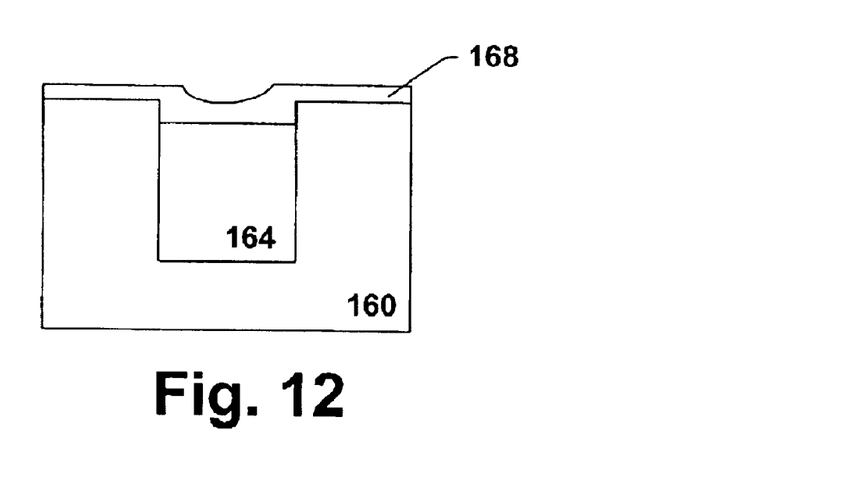

Referring to FIG. 12, a passive layer material 168 is deposited on the substrate (over the dielectric material 160 and the first electrode 164). For example, using gas phase reactions or CVD techniques, copper sulfide or copper oxide may be deposited over the substrate including over the copper electrode. Silver sulfide may be deposited over the substrate when a silver electrode is employed. Any material described to make the passive layer above may be employed.

Figure 13:
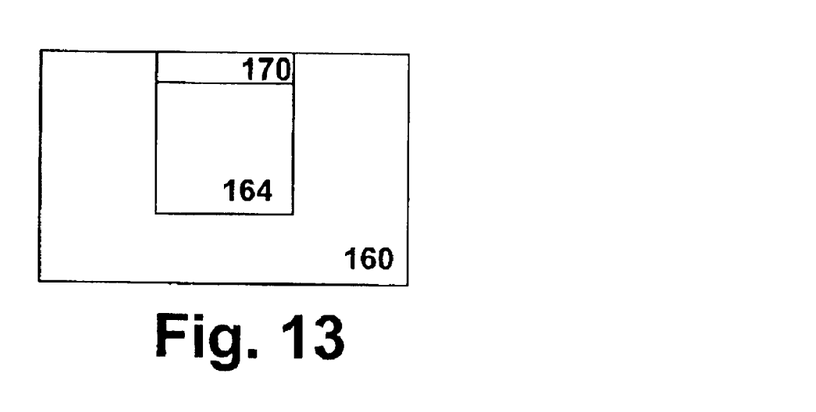

Referring to FIG. 13, CMP techniques are employed to planarize the substrate and confine the passive material to the well 166 thereby forming a passive layer 170 of a subsequently formed organic memory cell. A passive layer 170 is thereby formed over the first electrode 164 of a subsequently formed organic memory cell.

Figure 14:
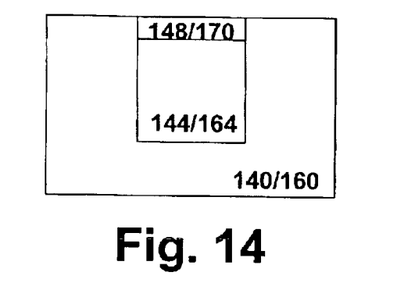
FIG. 14 illustrates a cross-sectional view of forming a passive layer in an organic memory cell in accordance with still yet another aspect of the present invention.

FIG. 14 shows an alternative exemplary aspect of forming a passive layer for an organic memory cell in accordance with the present invention, with reference to FIGS. 2 and 3 or FIGS. 10 and 11. That is, after the processing described for FIG. 3, or after the processing described for FIG. 11, the following processing is employed. A passive layer 148/170 is formed within the well over the first electrode 144/164, but not over the dielectric material 140/160. A passive layer 148/170 is thereby formed over the first electrode 144/164 of a subsequently formed organic memory cell.

When forming passive layer within a well over the first electrode, several techniques may be employed: oxidative growth and implantation. Growth techniques involve heating the substrate within an oxygen containing atmosphere (for example, to form a copper oxide passive layer over a copper containing electrode, a titanium dioxide passive layer over a titanium containing electrode, indium oxide passive layer over an indium containing electrode, or an iron oxide passive layer over an iron containing electrode, etc.), or within a sulfur containing atmosphere (for example, to form a copper sulfide passive layer over a copper containing electrode, a silver sulfide passive layer over a silver containing electrode, a gold sulfide passive layer over a gold containing electrode, etc.).

In one embodiment, the substrate is heated from about 100° C. to about 500° C. for a time from about 1 second to about 30 minutes in an atmosphere containing either oxygen containing compound or sulfur containing compound optionally with an inert gas. In another embodiment, the substrate is heated from about 100° C. to about 500° C. for a time from about 10 seconds to about 10 minutes in an atmosphere containing either oxygen containing compound or sulfur containing compound optionally with an inert gas.

Implantation involves implanting oxygen, sulfur, and/or arsenic into the electrode so that a metal oxide, metal sulfide or metal arsenide may form. In one embodiment, the electrode is implanted with oxygen, sulfur, and/or arsenic at a concentration from about $1 \times 10^{11}$ to about $1 \times 10^{17}$ atoms/cm$^2$ at an energy level from about 1 keV to about 100 keV. In another embodiment, the electrode is implanted with oxygen, sulfur, and/or arsenic at a concentration from about $1 \times 10^{12}$ to about $1 \times 10^{16}$ atoms/cm$^2$ at an energy level from about 10 keV to about 70 keV.

Figure 15:
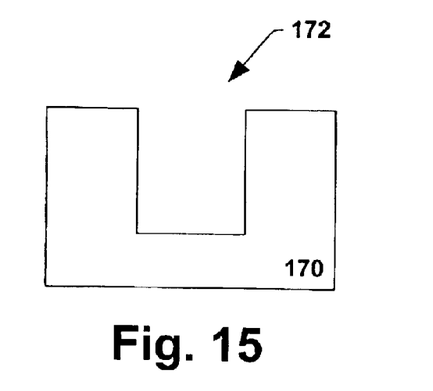
FIGS. 15 to 17 illustrate a cross-sectional view of forming an electrode and a passive layer in an organic memory cell in accordance with still yet another aspect of the present invention.
Figure 16:
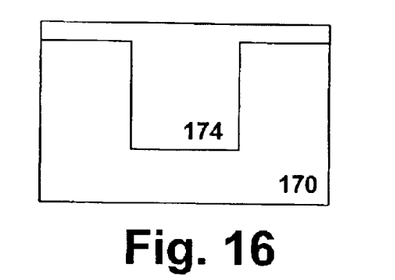
Figure 17:
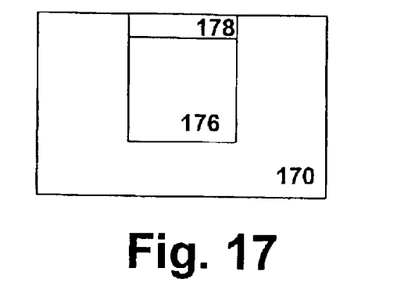

FIGS. 15 to 17 show yet another exemplary aspect of forming an electrode and a passive layer in an organic memory cell in accordance with the present invention. Specifically referring to FIG. 15, a memory substrate or wafer is provided containing a dielectric material 170. Within the wafer or dielectric material 170 are a plurality of organic memory cell wells 172. Although only one well 172 is shown, the entire wafer may have hundreds, thousands, or millions of wells, depending upon the size of the wells 172 and the size of the wafer. As shown, the organic memory cell well 172 is partially formed, as it will subsequently contain the first electrode and passive layer. Additional dielectric material will be formed to surround the organic semiconductor material and second electrode.

Referring to FIG. 16, an electrode material 174, preferably a conductive metal, is provided in the well 172 and over the wafer or dielectric material 170. The electrode material 174 is formed by any suitable manner including electroplating or sputtering (PVD). Numerous electrode materials are described above.

Referring to FIG. 17, CMP techniques are employed to remove the first electrode material 174 from the top surfaces of the dielectric material 170 not located in the well 172 and simultaneously convert the upper portion of the electrode material 174 into a passive material, thereby forming a passive layer 178 above the electrode 176. In this connection, the polishing slurry contains a reducing agent, such as a sulfur containing compound, which reacts with the electrode material to form a passive material. Since the reaction is limited to the portion of the electrode material in contact with the slurry (the top surface of the electrode material), the passive layer is conveniently formed in the upper portion of the well 172.

In some instances, to promote long charge retention times (in the organic semiconductor layer), the passive layer may be treated with a plasma after it is formed. The plasma treatment modifies the energy barrier of the passive layer.

In one embodiment, the organic memory cells optionally contain a heterocyclic/aromatic compound layer. In another embodiment, the organic semiconductor layer is doped with a heterocyclic/aromatic compound. If present, the heterocyclic/aromatic compound layer has a thickness of about 0.001 μm or more and about 1 μm or less. Examples of the chemical structures of various heterocyclic/aromatic compounds specifically including nitrogen containing heterocycles, include Formulae (XVIII) to (XXIII):

(XVIII)

(XIX)

(XX)

(XXI)

(XXII)

(XXIII)

The area size of the individual organic memory cells (as measured by the surface area of the two electrodes directly overlapping each other) can be small compared to conventional silicon based inorganic memory cells such as MOSFETs. In one embodiment, the area size of the organic memory cells of the present invention is about 0.0001 $\mu m^2$ or more and about 4 $\mu m^2$ or less. In another embodiment, the area size of the organic memory cells is about 0.001 $\mu m^2$ or more and about 1 $\mu m^2$ or less.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" slate).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. Switching the organic memory cell to the "off" state from the "on" state occurs when an external stimuli does not exceed a threshold value or does not exist. The threshold value varies depending upon a number of factor including the identity of the materials that constitute the organic memory cell and the passive layer, the thickness of the various layers, and the like.

Generally speaking, the presence of an external stimuli such as an applied electric field that exceeds a threshold value ("on" state) permits an applied voltage to write or erase information into/from the organic memory cell and the presence of an external stimuli such as an applied electric field that is less than a threshold value permits an applied voltage to read information from the organic memory cell; whereas the absence of the external stimuli that exceeds a threshold value ("off" state) prevents an applied voltage to write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance state or a high impedance state (and thus whether it is "on" or "off"). To erase information written into the organic memory cell, a negative voltage or a polarity opposite the polarity of the writing signal that exceeds a threshold value is applied.

The organic memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The organic memory devices may be fabricated in planar orientation (two dimensional) or three dimensional orientation containing at least two planar arrays of the organic memory cells.

Figure 18:
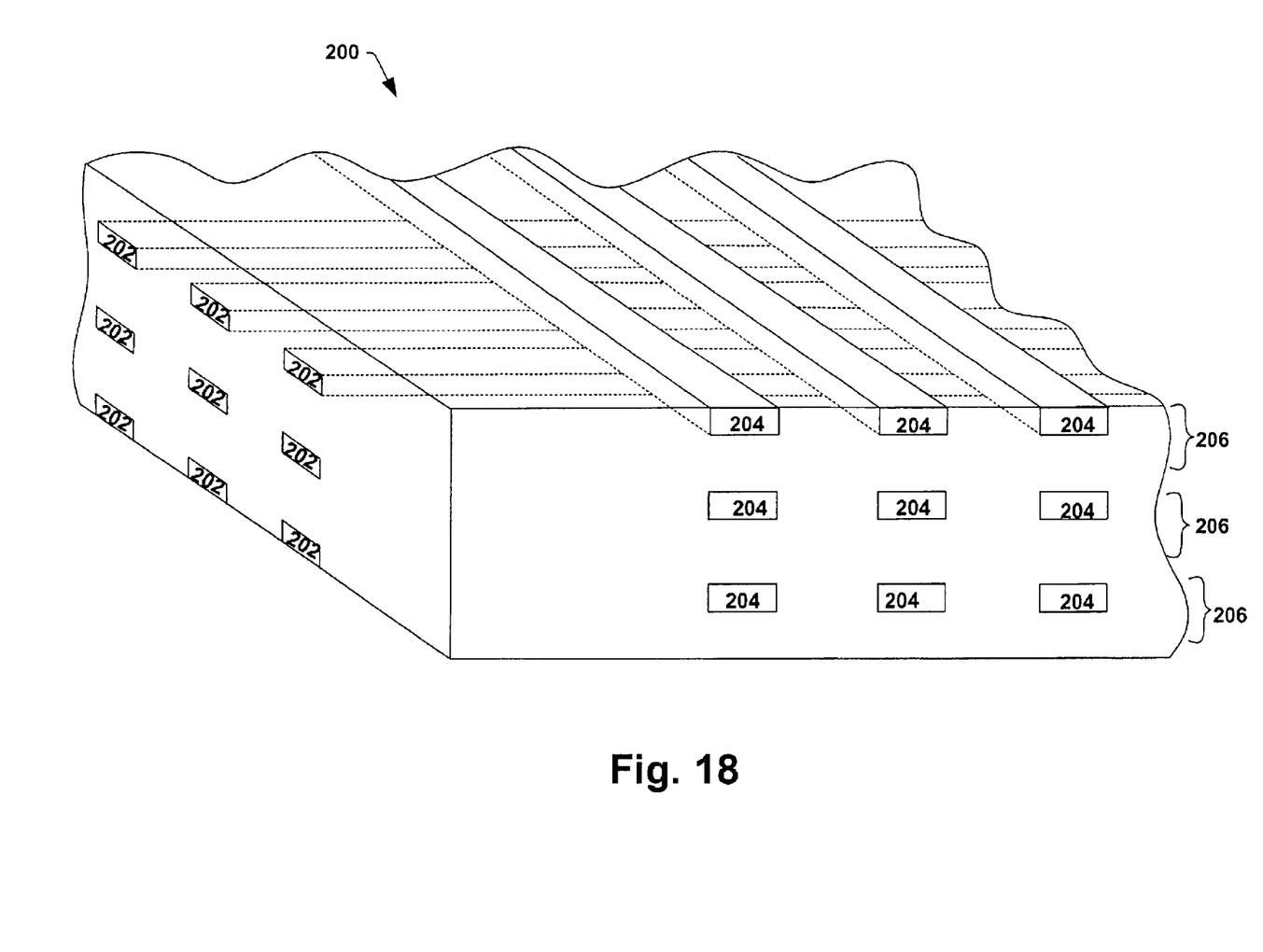
FIG. 18 illustrates a perspective view of a three dimensional microelectronic device containing a plurality of organic memory cells in accordance with another aspect of the invention.

Referring to FIG. 2, a three dimensional microelectronic organic memory device 200 containing a plurality of organic memory cells in accordance with an aspect of the invention is shown. The three dimensional microelectronic organic memory device 200 contains a plurality of first electrodes 202, a plurality of second electrodes 204, and a plurality of memory cell layers 206. Between the respective first and second electrodes are the controllably conductive media (not shown). The plurality of first electrodes 202 and the plurality of second electrodes 204 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of tile invention may have been disclosed with respect to only one of several embodiments, such feature may be combined with one or more other features of the other embodiments as may be desired and advantageous for any given or particular application.

What is claimed is:

1. A method of making an organic memory cell comprising:
    providing a substrate comprising a plurality of wells;
    providing a first electrode material in the wells;
    removing a portion of the first electrode material to form first electrodes in the wells;
    depositing a passive layer material comprising a conductivity facilitating compound over the substrate;
    chemical mechanical polishing the passive layer material to form a passive layer in the well;
    forming an organic semiconductor layer over the passive layer; and
    providing a second electrode over the organic semiconductor layer.

2. The method of claim 1, wherein the first electrode material is provided in the wells by electroplating, and a portion of the first electrode material is removed by reverse plating.

3. The method of claim 1, wherein the passive layer material is deposited by one of gas phase reaction or chemical vapor deposition techniques.

4. The method of claim 1, wherein the organic semiconductor layer comprises at least one selected from the group consisting of a conjugated organic polymer, a conjugated organometallic compound, a conjugated organometallic polymer, a buckyball, and a carbon nanotube.

5. The method of claim 1, wherein the organic semiconductor layer comprises at least one conjugated organic polymer selected from the group consisting of polyacetylene; polyphenylacetylene; polydiphenylacetylene; polyaniline; poly (p-phenylene vinylene); polythiophene; polyporphyrins; porphyrinic macrocycles, thiol derivatized polyporphyrins; polymetallocenes, polyphthalocyanines; polyvinylenes; and polystiroles.

6. The method of claim 1, wherein the conductivity facilitating compound comprises at least one selected from the group consisting of copper sulfide, copper oxide, manganese oxide, titanium dioxide, indium oxide, silver sulfide, gold sulfide, nickel arsenide, cobalt arsenide, and iron oxide.

7. The method of claim 1, wherein the first electrode and the second electrode independently comprise at least one selected from the group consisting of aluminum, chromium, copper, germanium, gold, magnesium, manganese, indium, iron, nickel, palladium, platinum, silver, titanium, zinc, and alloys thereof.

8. A method of making an organic memory cell comprising:
    providing a substrate comprising a plurality of wells;
    providing a first electrode material in the wells;
    removing a portion of the first electrode material to form first electrodes in the wells;
    forming a passive layer comprising a conductivity facilitating compound over the first electrodes in the wells;
    forming an organic semiconductor layer over the passive layer; and
    providing a second electrode over the organic semiconductor layer.

9. The method of claim 8, wherein the first electrode material is provided in the wells by electroplating, and a portion of the first electrode material is removed by reverse plating.

10. The method of claim 8, wherein the passive layer is formed by one of i) growth in an oxygen or sulfur containing environment, and ii) implantation of one of oxygen, sulfur and arsenic.

11. The method of claim 8, wherein the passive layer is annealed before forming the organic semiconductor layer.

12. The method of claim 8, wherein the conductivity facilitating compound comprises at least one selected from the group consisting of copper sulfide, copper oxide, manganese oxide, titanium dioxide, indium oxide, silver sulfide, gold sulfide, nickel arsenide, cobalt arsenide, and iron oxide.

13. The method of claim 8, wherein the organic semiconductor layer comprises at least one conjugated organic polymer selected from the group consisting of polyacetylene; polyphenylacetylene; polydiphenylacetylene; polyaniline; poly (p-phenylene vinylene); polythiophene; polyporphyrins; porphyrinic macrocycles, thiol derivatized polyporphyrins; polymetallocenes, polyphthalocyanines; polyvinylenes; and polystiroles.

14. A method of making an organic memory cell comprising:
    providing a first electrode on a substrate;
    forming a passive layer comprising a conductivity facilitating compound over the first electrode and substrate;
    patterning a mask over the substrate, so that the mask is positioned over the first electrode thereby leaving exposed portions of the passive layer;

removing the exposed portions of the passive layer;

removing the mask;

forming an organic semiconductor layer over the passive layer; and providing a second electrode over the organic semiconductor layer.

15. The method of claim 14, wherein the first electrode material is provided by electroplating or sputtering.

16. The method of claim 14, wherein the passive layer is formed by one of gas phase reaction or chemical vapor deposition techniques.

17. The method of claim 14, wherein the mask is patterned using photolithography.

18. The method of claim 14, wherein the organic semiconductor layer comprises at least one conjugated organic polymer selected from the group consisting of polyacetylene; polyphenylacetylene; polydiphenylacetylene; polyaniline; poly (p-phenylene vinylene); polythiophene; polyporphyrins; porphyrinic macrocycles, thiol derivatized polyporphyrins; polymetallocenes, polyphthalocyanines; polyvinylenes; and polystiroles and the conductivity facilitating compound comprises at least one selected from the group consisting of copper sulfide, copper oxide, manganese oxide, titanium dioxide, indium oxide, silver sulfide, gold sulfide, nickel arsenide, cobalt arsenide, and iron oxide.

19. A method of making an organic memory cell comprising:

providing a substrate comprising a plurality of wells;

providing a first electrode material in the wells and over the substrate;

simultaneously removing a first portion of the first electrode material and converting a second portion of the first electrode material to a passive material comprising a conductivity facilitating compound to form first electrodes and passive layers in the wells;

forming an organic semiconductor layer over the passive layer; and providing a second electrode over the organic semiconductor layer.

20. The method of claim 19, wherein removing the first portion of the first electrode material and converting the second portion of the first electrode material to the passive material is performed by chemical mechanical polishing using a slurry comprising a reducing agent.

21. The method of claim 20, wherein the reducing agent comprises a sulfur containing compound.

22. The method of claim 19, wherein the first electrode material is provided by electroplating or sputtering.

23. The method of claim 19, wherein the organic semiconductor layer comprises a conjugated organic polymer, and the conjugated organic polymer is formed by chemical vapor deposition and a catalytic action of the passive layer.

* * * * *